(12) United States Patent
Sandhu et al.

(10) Patent No.: US 8,357,970 B2
(45) Date of Patent: Jan. 22, 2013

(54) MULTI-LEVEL CHARGE STORAGE TRANSISTORS AND ASSOCIATED METHODS

(75) Inventors: Gurtej S. Sandhu, Boise, ID (US); Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 12/757,727

(22) Filed: Apr. 9, 2010

(65) Prior Publication Data

US 2011/0248334 A1    Oct. 13, 2011

(51) Int. Cl.
   *H01L 29/423*    (2006.01)
   *H01L 29/788*    (2006.01)
   *H01L 29/78*     (2006.01)
   *H01L 29/792*    (2006.01)

(52) U.S. Cl. ............. 257/329; 257/316; 257/E29.13; 257/E29.131; 257/E29.3; 257/E29.262; 257/E29.309

(58) Field of Classification Search ............ 257/316, 257/329, E29.129, E29.13, E29.131, E29.3, 257/E29.262, E29.309
See application file for complete search history.

(56) References Cited

U.S. PATENT DOCUMENTS

| | | | |
|---|---|---|---|
| 2008/0002475 A1* | 1/2008 | Yang et al. | 365/185.26 |
| 2008/0067583 A1* | 3/2008 | Kidoh et al. | 257/326 |
| 2008/0157092 A1* | 7/2008 | Arai et al. | 257/67 |
| 2009/0310425 A1* | 12/2009 | Sim et al. | 365/185.29 |
| 2010/0067301 A1* | 3/2010 | Kim et al. | 365/185.18 |
| 2011/0024827 A1* | 2/2011 | Arai et al. | 257/326 |

* cited by examiner

*Primary Examiner* — Victor A Mandala
(74) *Attorney, Agent, or Firm* — Schwegman, Lundberg & Woessner, P.A.

(57) ABSTRACT

Methods of fabricating charge storage transistors are described, along with apparatus and systems that include them. In one such method, a pillar of epitaxial silicon is formed. At least first and second charge storage nodes (e.g., floating gates) are formed around the pillar of epitaxial silicon at different levels. A control gate is formed around each of the charge storage nodes. Additional embodiments are also described.

26 Claims, 18 Drawing Sheets

MULTI-LEVEL CHARGE STORAGE TRANSISTORS AND ASSOCIATED METHODS

BACKGROUND

Non-volatile semiconductor memories (NVSMs) are widely used in many electronic devices such as personal digital assistants (PDAs), laptop computers, mobile phones and digital cameras. Some of these memories have arrays of charge storage transistors, such as floating gate transistors.

BRIEF DESCRIPTION OF THE DRAWINGS

Some embodiments are illustrated by way of example and not limitation in the figures of the accompanying drawings in which.

DETAILED DESCRIPTION

In the following description, for purposes of explanation, numerous examples having example-specific details are set forth to provide an understanding of example embodiments.

Embodiments of example structures and methods of fabricating an array of charge storage devices will now be described. Charge storage devices may be, for example, polysilicon floating gate devices or charge trap devices, such as those having discrete trapping layers (e.g., using conductive nanodots) or continuous trapping layers (e.g., silicon-oxide-nitride-oxide-silicon (SONOS) devices), among others. An array of charge storage devices according to various embodiments of the invention may function as an array of memory cells in a memory device such as a NAND (not AND) memory device.

Figure 1A:
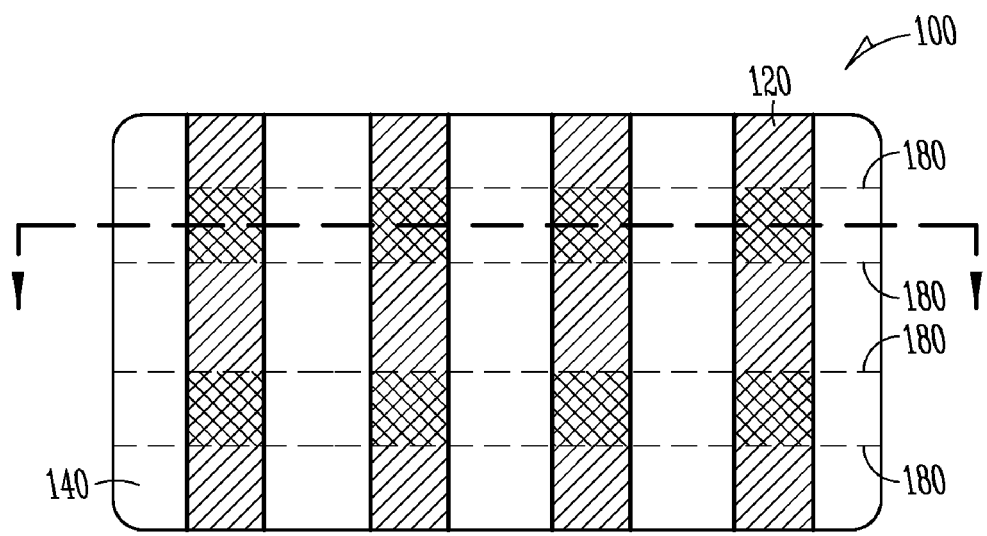
FIGS. 1A and 1B are a top view and a cross-sectional side view, respectively, of a semiconductor construction according to various embodiments of the invention.
Figure 1B:
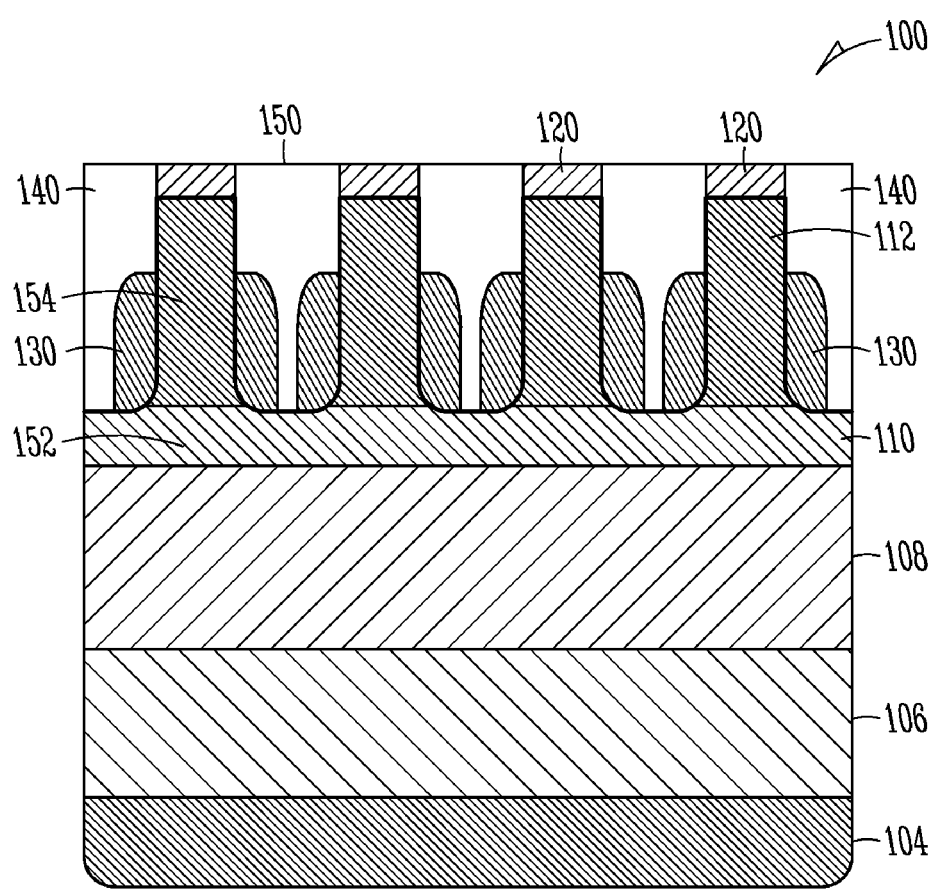

FIGS. 1A and 1B are a top view and a cross-sectional side view, respectively, of a semiconductor construction 100 according to various embodiments of the invention. Layers and regions in the semiconductor construction 100 will be identified by the same reference numerals throughout the drawings for purposes of brevity. The semiconductor construction 100 is formed in and/or on an arrangement of differently-doped layers of silicon, for example, layers 104, 106, 108, and 110. The semiconductor construction 100 includes, in order from bottom to top, a lightly P doped (P−) silicon layer 104, a P doped silicon layer 106, a heavily N doped (N+) silicon layer 108 and a lightly N doped (N−) silicon layer 110. Walls 112 of lightly P doped (P−) silicon extend from the silicon layer 110. A cap 120 of silicon nitride ($Si_3N_4$) is formed on top of each silicon wall 112.

A double-sided gate 130 is deposited on either side of each silicon wall 112 in the semiconductor construction 100, and silicon dioxide ($SiO_2$) is deposited in regions between the silicon walls 112 to form silicon dioxide plugs 140. Portions of the silicon dioxide plugs 140 and the cap 120 are then removed to form a suitable top surface 150. For example, the silicon dioxide plugs 140 and the cap 120 are subjected to planarization such as chemical-mechanical planarization (CMP) that leaves the top surface 150 planar. The top surface 150 is then polished flat. The double-sided gate 130 is a select gate for a vertical transistor to select charge storage transistors (not shown) above the double-sided gate 130. The vertical transistor has a source 152 in layer 110 and a channel 154 in the silicon wall 112 above the source 152 and between the double-sided gate 130. Horizontal lines 180 in FIG. 1A, the top view of the semiconductor construction 100, indicate borders of walls within the semiconductor construction 100 that separate transistors as will be described herein below. The double-sided gate 130 may be, for example, metal or silicon or a conductive metal nitride such as titanium nitride (TiN). The double-sided gate 130 may also be, for example, NiSi, Ru, Si, TaN, Ti, TiSi, WN, or $WSi_x$ according to various embodiments of the invention.

In all regions where $SiO_2$ exists, the $SiO_2$ can be replaced by, for example, oxide-nitride-oxide ($SiO_2Si_3N_4SiO_2$ or ONO, $AlO_x$, $HfAlO_x$, $LaAlO_x$, $LaO_x$, SiN, $ZrAlO_x$, $ZrO_x$ or $ZrSiO_x$ according to various embodiments of the invention.

Figure 2A:
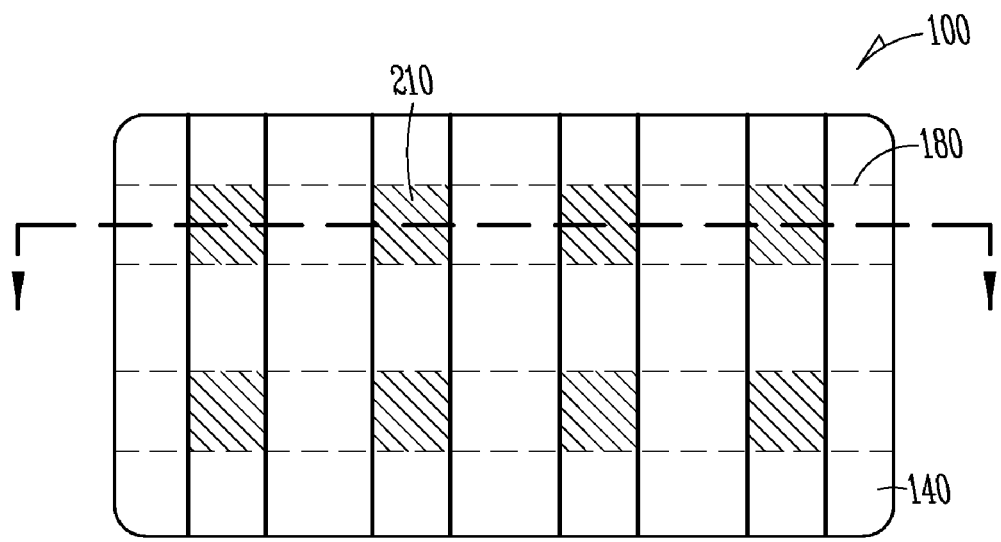
FIGS. 2A and 2B are a top view and a cross-sectional side view, respectively, of a semiconductor construction according to various embodiments of the invention.
Figure 2B:
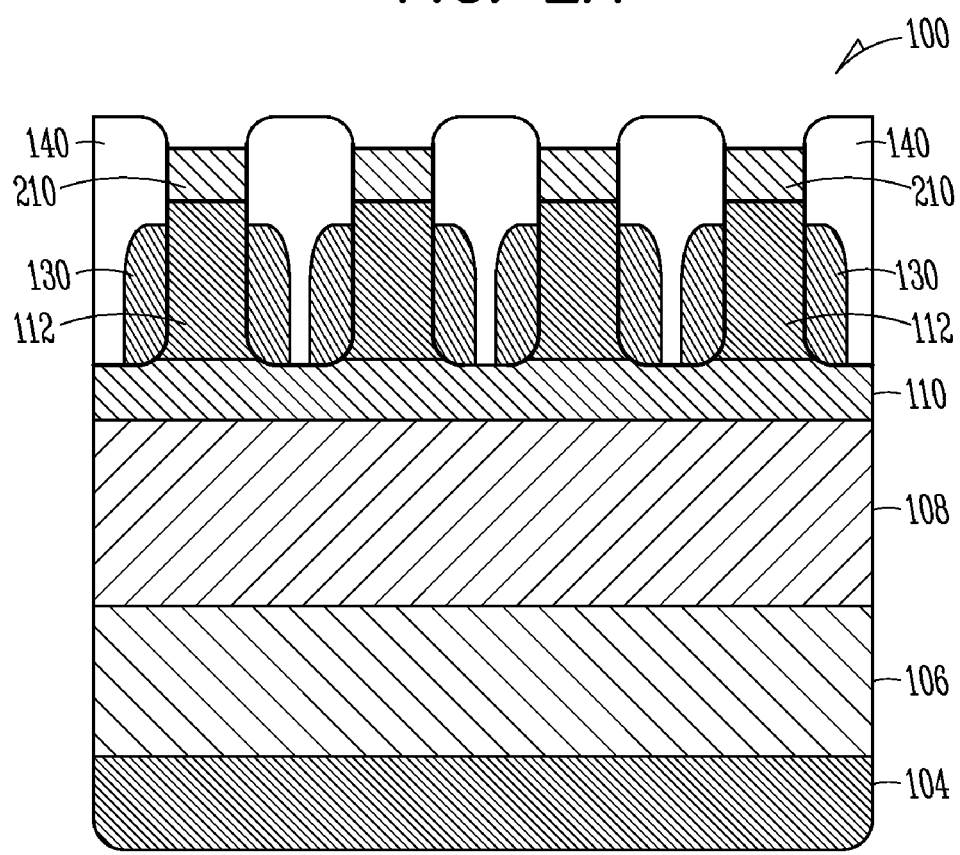

FIGS. 2A and 2B are a top view and a cross-sectional side view, respectively, of the semiconductor construction 100 according to various embodiments of the invention. The cap 120 and portions of the silicon dioxide plugs 140 are removed in FIG. 2A and FIG. 2B by a dry etch or a wet etch to expose the silicon walls 112. The silicon walls 112 receive an implant to form N– doped drains 210 of the vertical transistors above the channels 154.

Figure 3A:
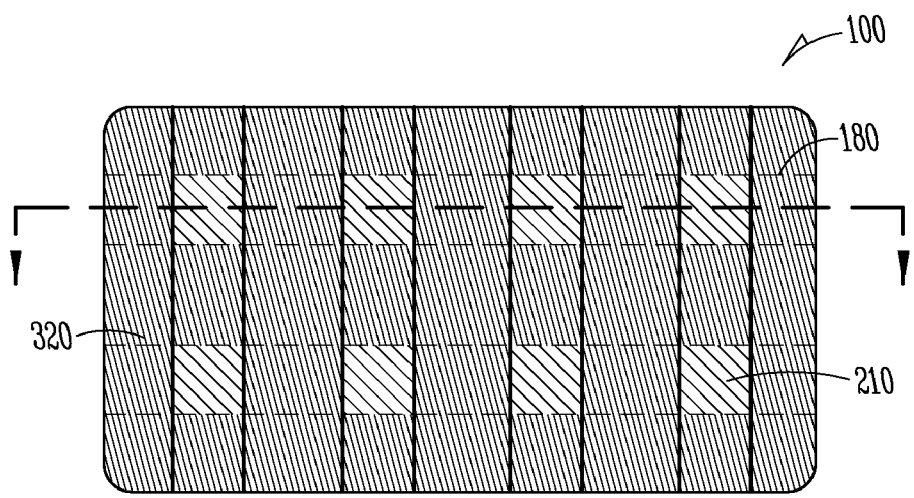
FIGS. 3A and 3B are a top view and a cross-sectional side view, respectively, of a semiconductor construction according to various embodiments of the invention.
Figure 3B:
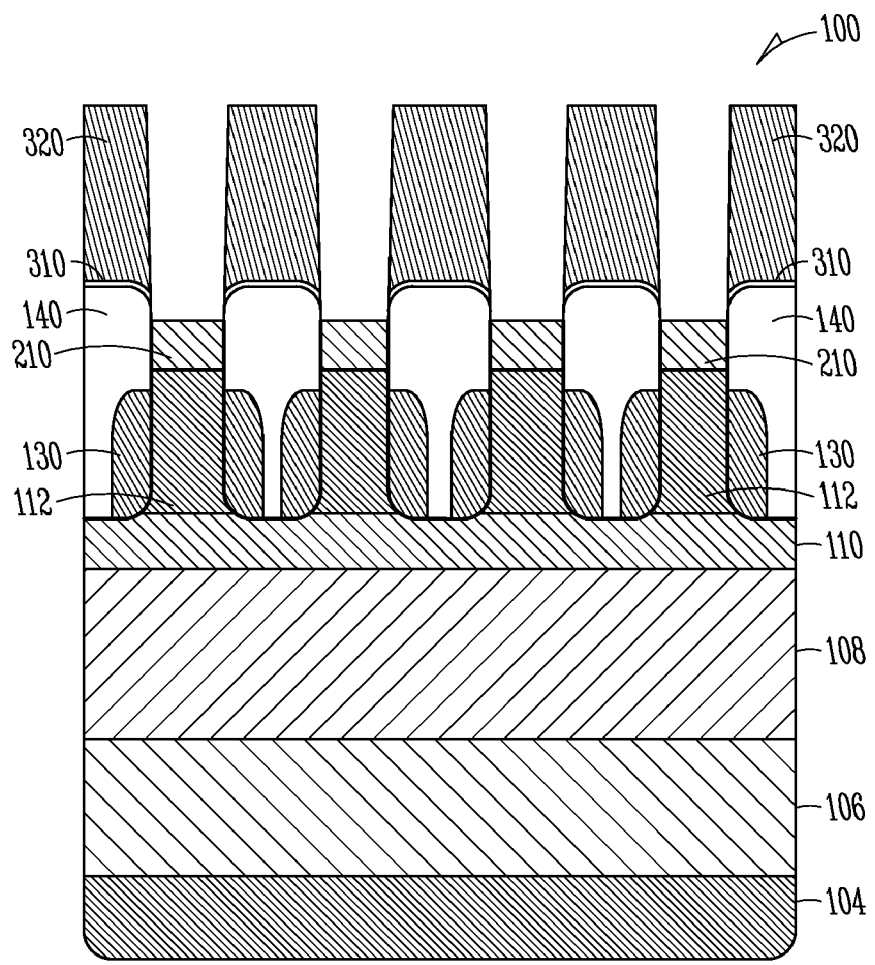

FIGS. 3A and 3B are a top view and a cross-sectional side view, respectively, of the semiconductor construction 100 according to various embodiments of the invention. The silicon dioxide plugs 140 and the drains 210 are covered by a liner 310 of silicon nitride. Silicon dioxide is then deposited on the liner 310. The liner 310 is 50 Angstroms thick and the silicon dioxide is Borophosphosilicate glass (BPSG) that is 1500 Angstroms thick for a high wet etch rate according to various embodiments of the invention. Portions of the silicon dioxide and the liner 310 are removed to expose the drains 210 between the silicon dioxide plugs 140. For example, the silicon dioxide and the liner 310 are patterned and etched with a nitride punch stopping on the silicon of the drains 210. A silicon dioxide grid 320 shown in FIG. 3A remains with substantially square holes that expose the drains 210.

Figure 4A:
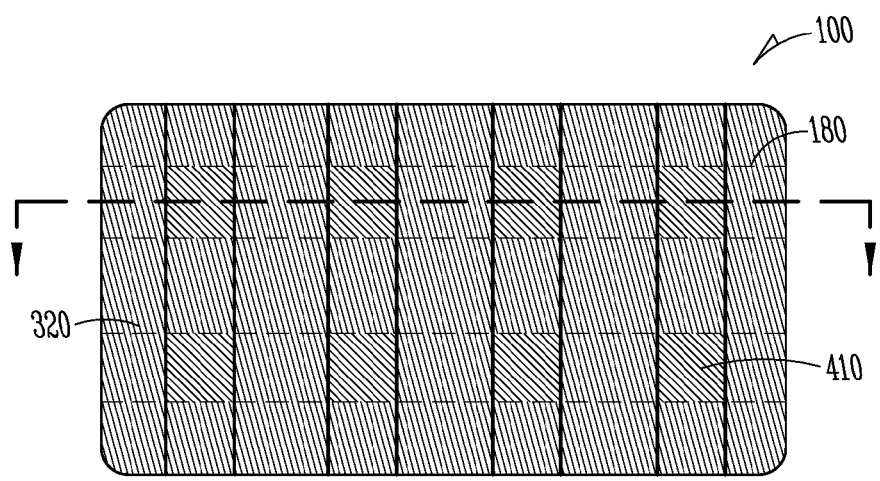
FIGS. 4A and 4B are a top view and a cross-sectional side view, respectively, of a semiconductor construction according to various embodiments of the invention.
Figure 4B:
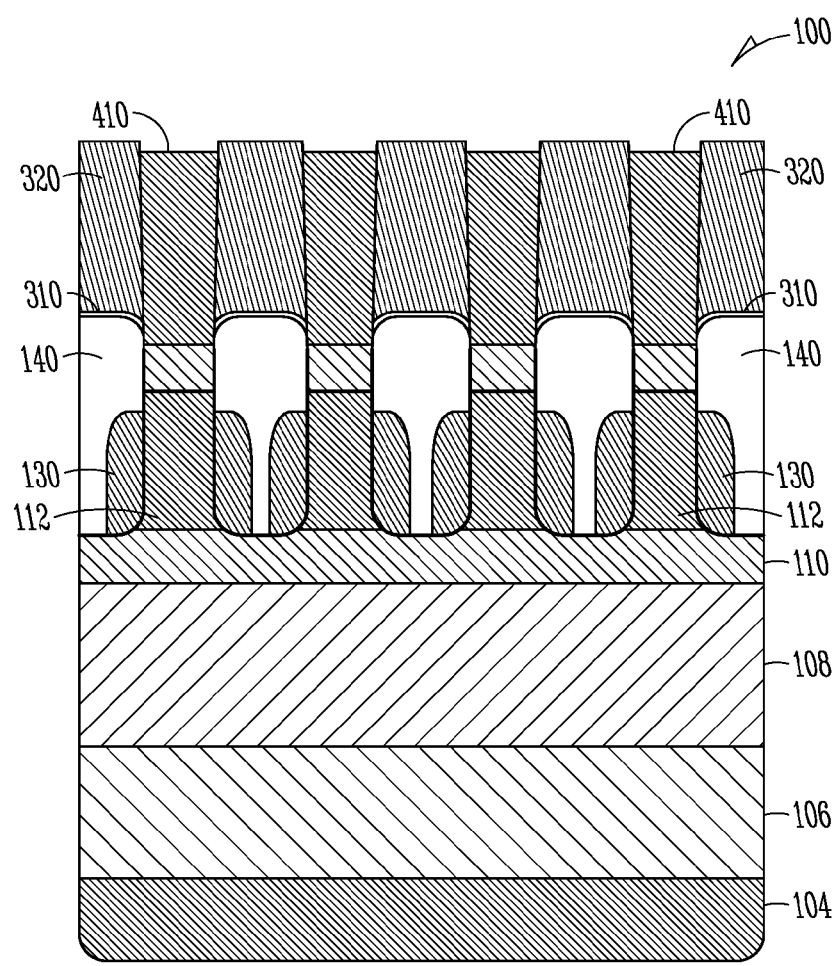

FIGS. 4A and 4B are a top view and a cross-sectional side view, respectively, of the semiconductor construction 100 according to various embodiments of the invention. Selective epitaxial grown (SEG) silicon 410 is grown on the drains 210 in the square holes up to the brim of the silicon dioxide grid 320. The epitaxial silicon 410 is single-crystal silicon having the same crystal size and orientation as the silicon of the drains 210. The epitaxial silicon 410 and the drains 210 become one material. The epitaxial silicon 410 may be deposited according to various embodiments of the invention. The epitaxial silicon 410 can be undoped. The epitaxial silicon 410 can also be doped through in situ doping during its growth. The epitaxial silicon 410 can be, for example, N-type silicon or P-type silicon according to various embodiments of the invention.

Figure 5A:
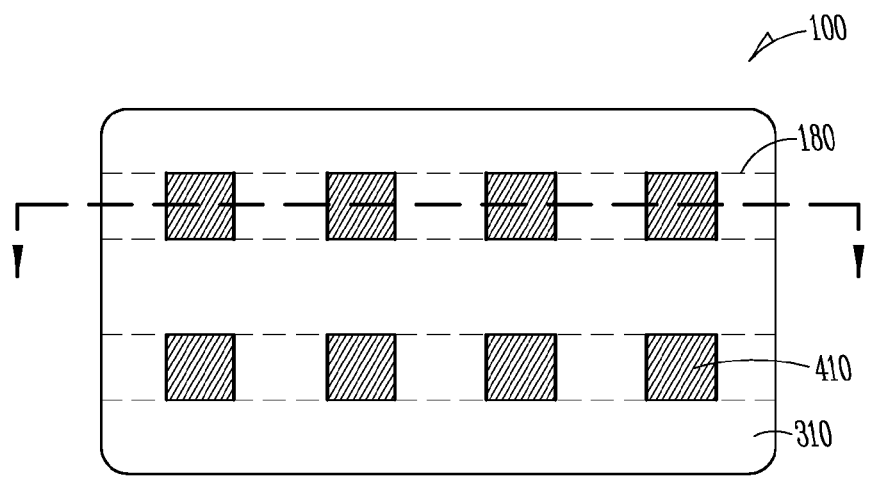
FIGS. 5A and 5B are a top view and a cross-sectional side view, respectively, of a semiconductor construction according to various embodiments of the invention.
Figure 5B:
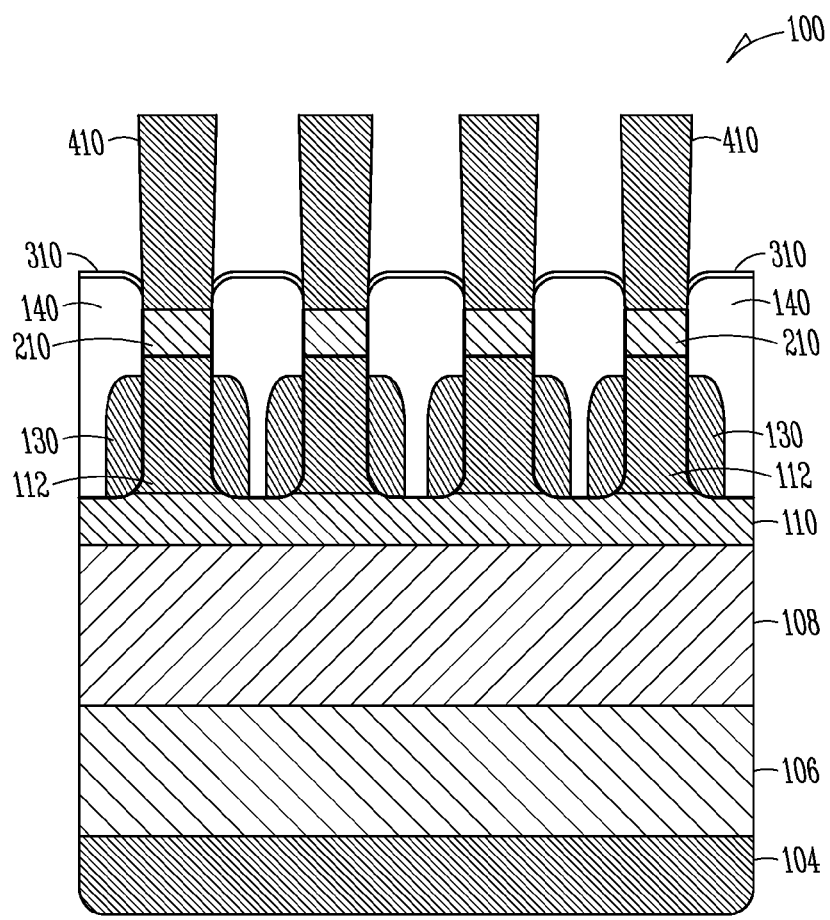

FIGS. 5A and 5B are a top view and a cross-sectional side view, respectively, of the semiconductor construction 100 according to various embodiments of the invention. The silicon dioxide grid 320 is selectively removed by a wet etch or a dry etch to expose the liner 310 over the silicon dioxide plugs 140. The selective removal of the silicon dioxide grid 320 stops on the epitaxial silicon and the liner 310. Pillars of the epitaxial silicon 410 remain once the silicon dioxide grid 320 is removed. The pillars of the epitaxial silicon 410 can function as channels for charge storage transistors.

Figure 6A:
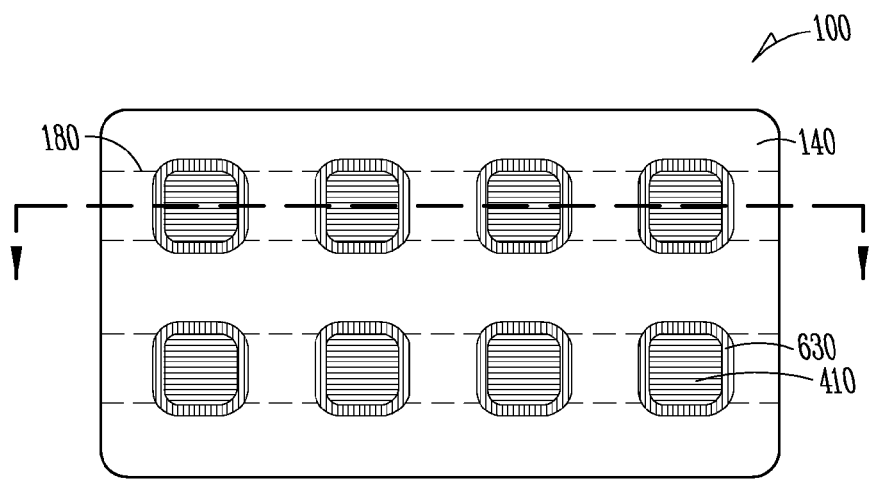
FIGS. 6A and 6B are a top view and a cross-sectional side view, respectively, of a semiconductor construction according to various embodiments of the invention.
Figure 6B:
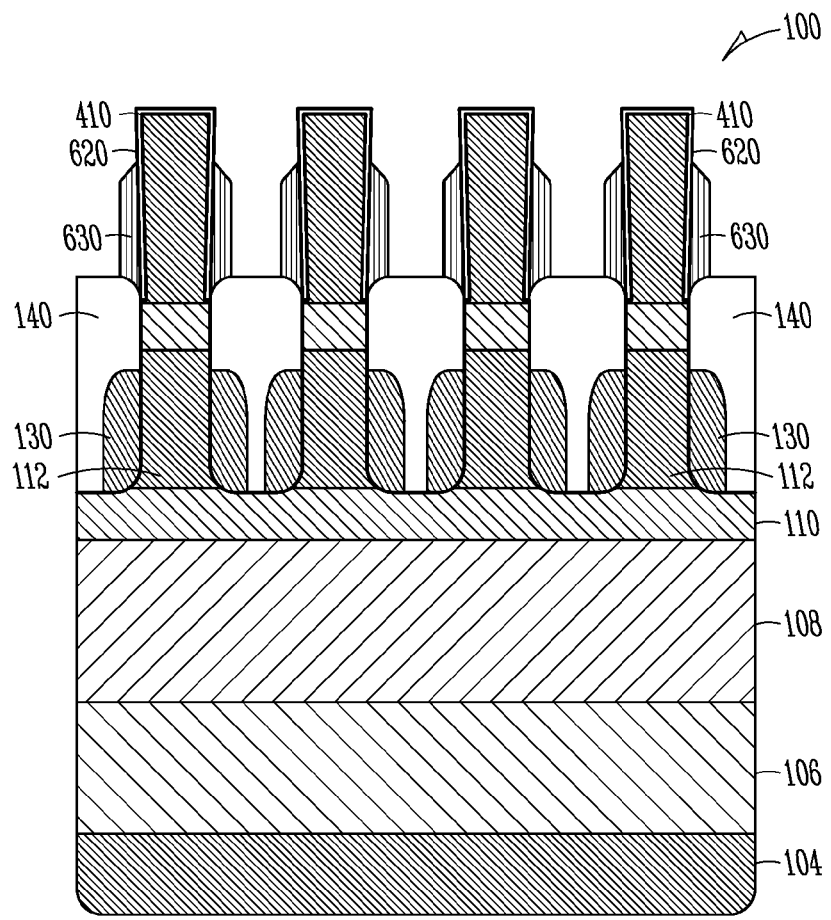

FIGS. 6A and 6B are a top view and a cross-sectional side view, respectively, of the semiconductor construction 100 according to various embodiments of the invention. The liner 310 over the silicon dioxide plugs 140 is selectively removed with hot phosphoric acid to reduce the amount of the liner 310 remaining. The semiconductor construction 100 is oxidized by thermal oxidation to grow a layer of silicon dioxide 620 on the pillars of epitaxial silicon 410. The silicon dioxide 620 is a tunnel oxide. Polysilicon is then deposited over the semiconductor construction 100. The polysilicon is etched by a blanket etch to form polysilicon floating gates 630 around the pillars of epitaxial silicon 410 and the tunnel oxide 620. The polysilicon floating gates 630 are recessed approximately 500 Angstroms below the pillars of epitaxial silicon 410 according to various embodiments of the invention. The term "around" includes both "surrounding" and "partially surrounding." The polysilicon floating gates 630 are separated from the pillars of epitaxial silicon 410 by the tunnel oxide 620.

Figure 7A:
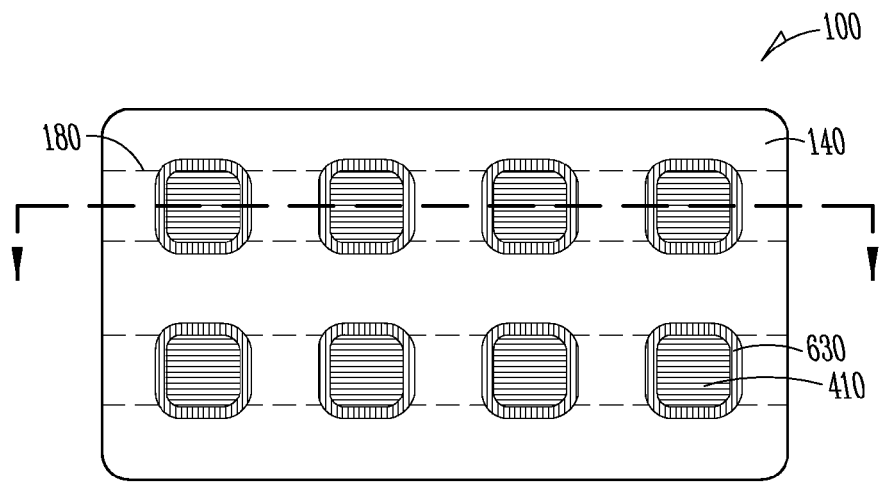
FIGS. 7A and 7B are a top view and a cross-sectional side view, respectively, of a semiconductor construction according to various embodiments of the invention.
Figure 7B:
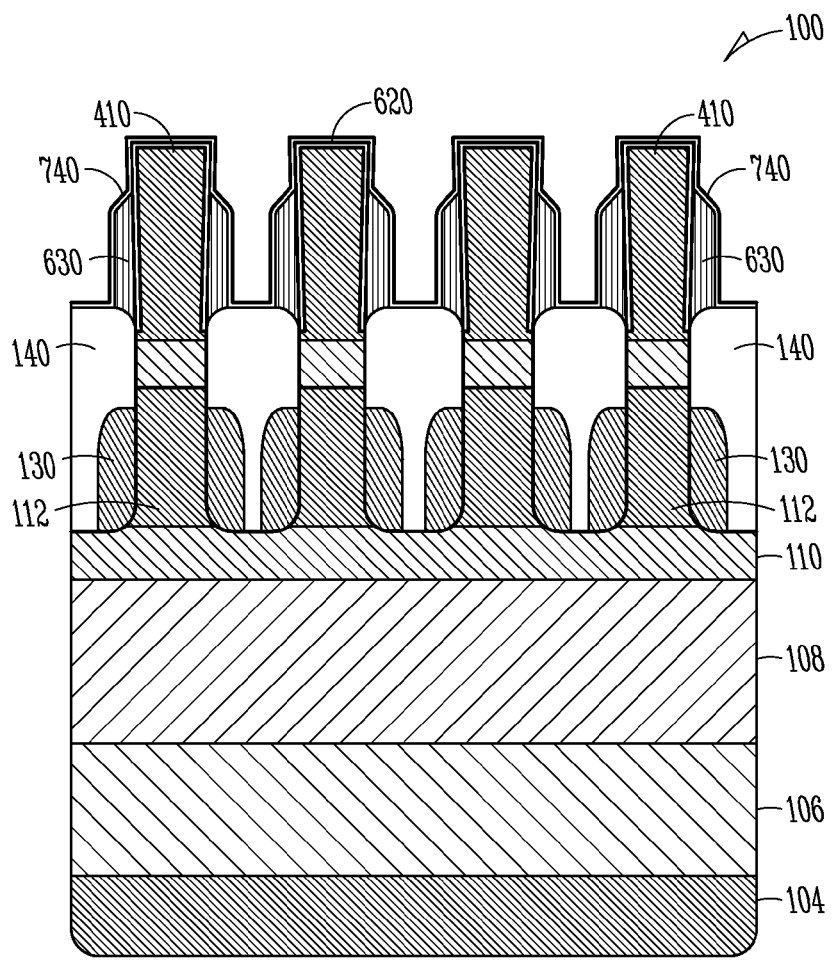

FIGS. 7A and 7B are a top view and a cross-sectional side view, respectively, of the semiconductor construction 100 according to various embodiments of the invention. An inter-poly dielectric layer 740 is deposited on the semiconductor construction 100 over the silicon dioxide plugs 140, the poly-silicon floating gates 630 and the pillars of epitaxial silicon 410. The inter-poly dielectric layer 740 is ONO according to various embodiments of the invention.

In all regions where ONO exists, the ONO can be replaced by, for example, $AlO_x$, $HfAlO_x$, $LaAlO_x$, $LaO_x$, SiN, $SiO_2$, $ZrAlO_x$, $ZrO_x$ or $ZrSiO_x$ according to various embodiments of the invention.

Figure 8A:
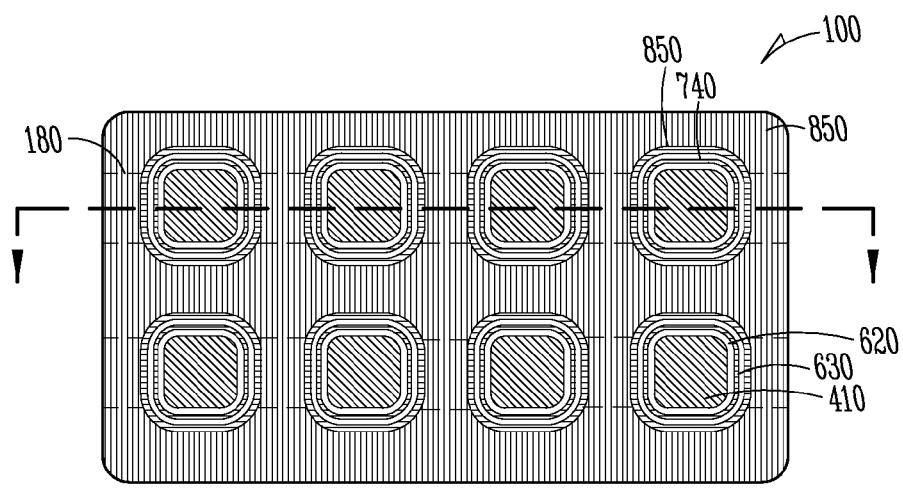
FIGS. 8A and 8B are a top view and a cross-sectional side view, respectively, of a semiconductor construction according to various embodiments of the invention.
Figure 8B:
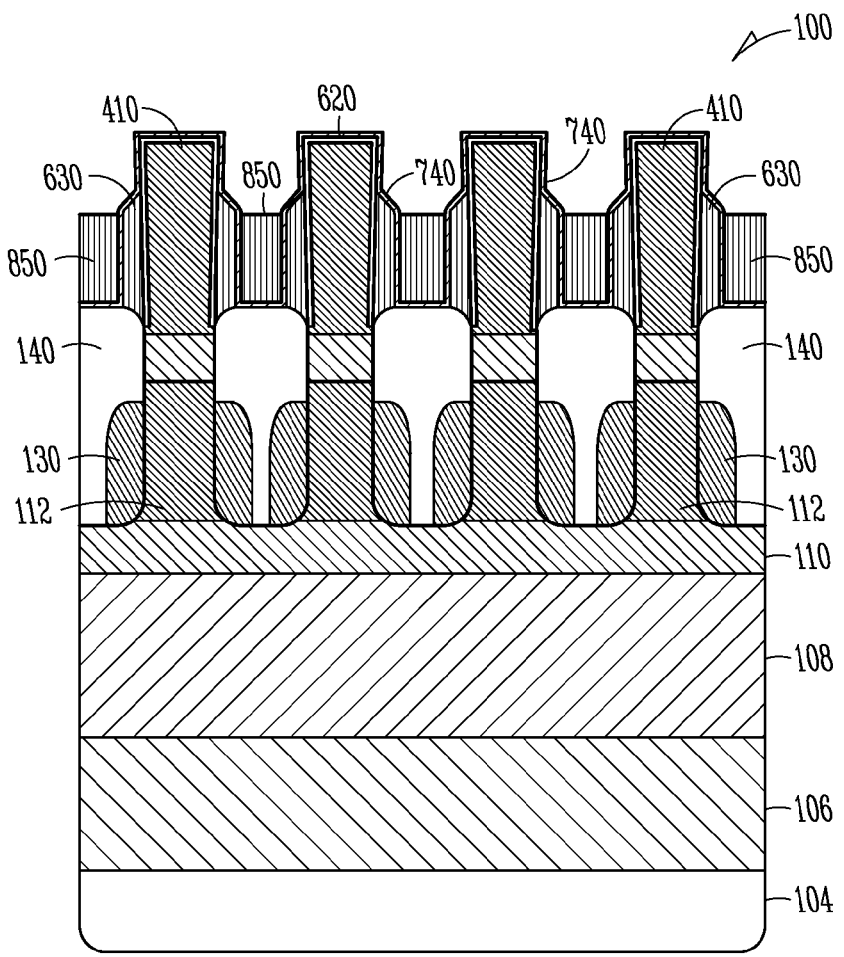

FIGS. 8A and 8B are a top view and a cross-sectional side view, respectively, of the semiconductor construction 100 according to various embodiments of the invention. Titanium nitride is deposited on the semiconductor construction 100 and the titanium nitride is etched by a blanket wet etch or dry etch to form control gates 850 between the pillars of epitaxial silicon 410 over the inter-poly dielectric layer 740, the silicon dioxide plugs 140 and beside the polysilicon floating gates 630. The control gates 850 are formed around (e.g., surrounding or partially surrounding) the pillars of epitaxial silicon 410 according to various embodiments of the invention. The control gates 850 may be, for example, silicon, another conductive metal nitride or a metal. The control gates 850 may also be, for example, NiSi, Ru, TaN, Ti, TiSi, WN, or $WSi_x$ according to various embodiments of the invention. The control gates 850 are recessed at or below the polysilicon floating gates 630. The control gates 850 are separated from the polysilicon floating gates 630 by the inter-poly dielectric layer 740. The exposed ONO of the inter-poly dielectric layer 740 is removed as much as possible by an ONO punch.

Figure 9A:
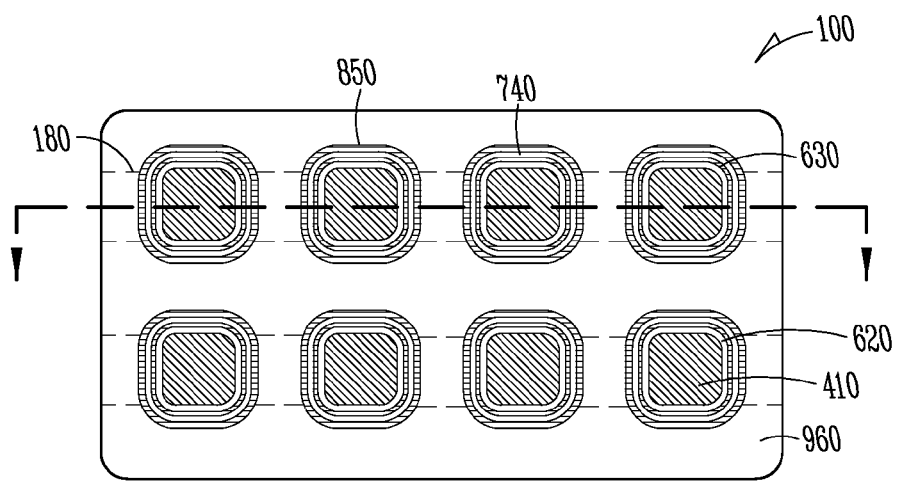
FIGS. 9A and 9B are a top view and a cross-sectional side view, respectively, of a semiconductor construction according to various embodiments of the invention.
Figure 9B:
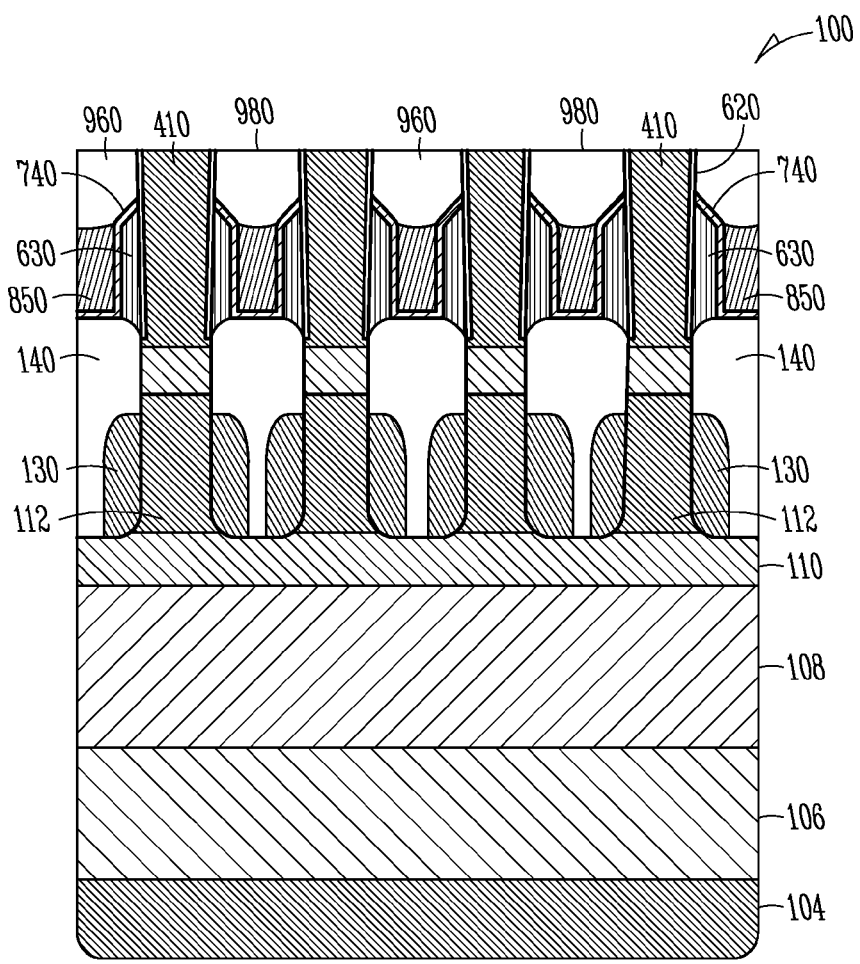

FIGS. 9A and 9B are a top view and a cross-sectional side view, respectively, of the semiconductor construction 100 according to various embodiments of the invention. Spaces between the pillars of epitaxial silicon 410 are filled with silicon dioxide 960. Portions of the silicon dioxide 960, the tunnel oxide 620 and the inter-poly dielectric layer 740 are then removed to form a suitable top surface 980. For example, the silicon dioxide 960, the inter-poly dielectric layer 740 and the pillars of epitaxial silicon 410 are subjected to planarization such as CMP that leaves the top surface 980 planar. The top surface 980 may then be polished flat. Polishing the top surface 980 exposes the pillars of epitaxial silicon 410. The pillars of epitaxial silicon 410, the tunnel oxide 620, the floating gates 630, the inter-poly dielectric layer 740, the control gates 850 and the silicon dioxide 960 represent a first level of complete charge storage transistors of a vertical flash cell array of the semiconductor construction 100.

Figure 10A:
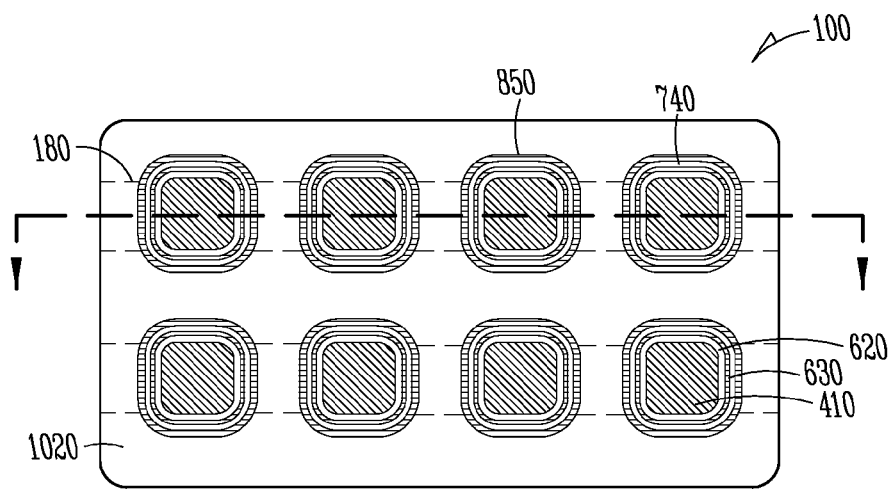
FIGS. 10A and 10B are a top view and a cross-sectional side view, respectively, of a semiconductor construction according to various embodiments of the invention.
Figure 10B:
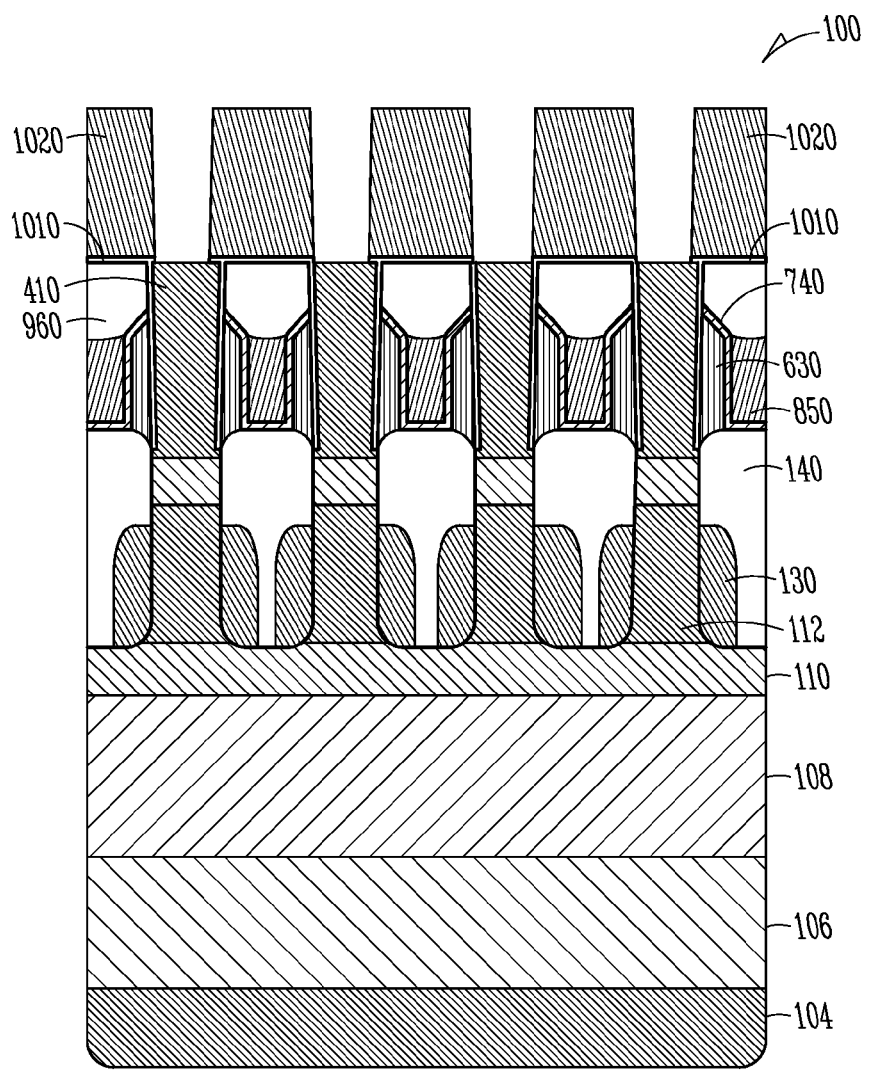

FIGS. 10A and 10B are a top view and a cross-sectional side view, respectively, of the semiconductor construction 100 according to various embodiments of the invention. The silicon dioxide 960 and the pillars of epitaxial silicon 410 are covered by a liner 1010 of silicon nitride. Silicon dioxide is then deposited on the liner 1010. The liner 1010 is 50 Angstroms thick and the silicon dioxide is BPSG that is 1500 Angstroms thick for a high wet etch rate according to various embodiments of the invention. Portions of the silicon dioxide and the liner 1010 are removed to expose the pillars of epitaxial silicon 410 between the silicon dioxide. For example, the silicon dioxide and the liner 1010 are patterned and etched to leave a silicon dioxide grid 1020 shown in FIG. 10A with substantially square holes that expose the pillars of epitaxial silicon 410.

Figure 11A:
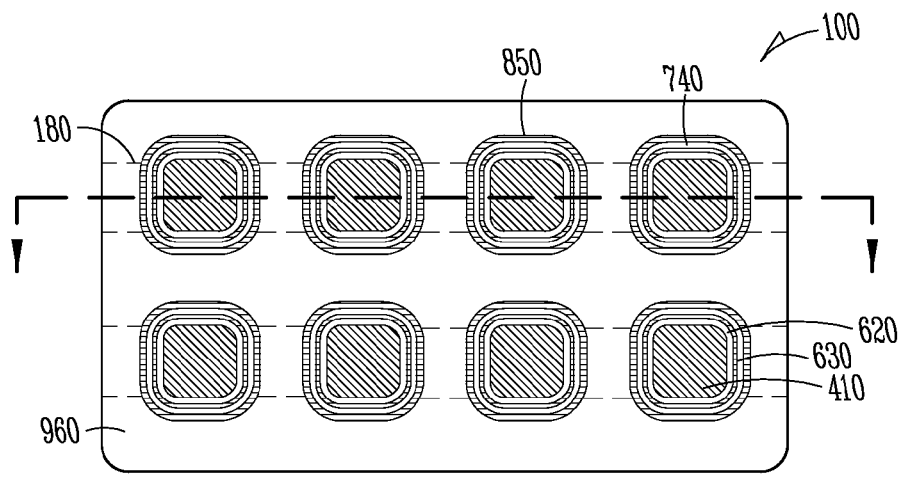
FIGS. 11A and 11B are a top view and a cross-sectional side view, respectively, of a semiconductor construction according to various embodiments of the invention.
Figure 11B:
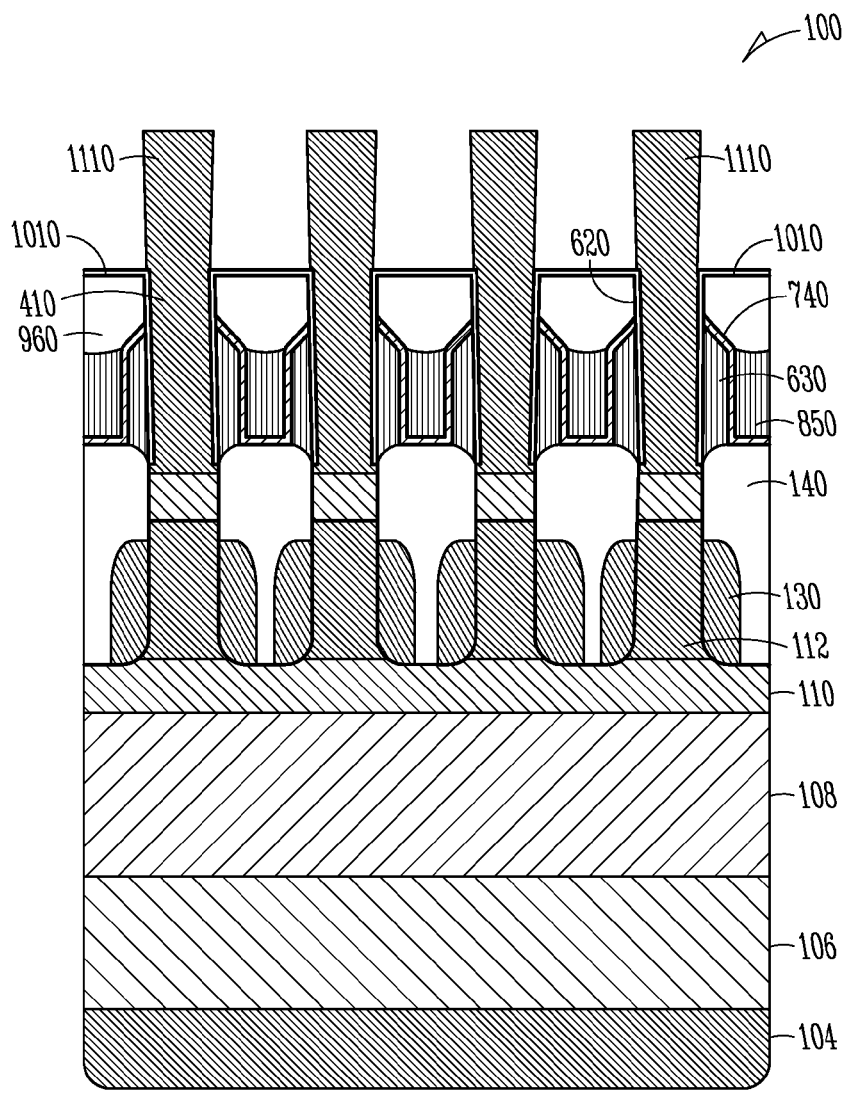

FIGS. 11A and 11B are a top view and a cross-sectional side view, respectively, of the semiconductor construction 100 according to various embodiments of the invention. SEG silicon 1110 is grown on the exposed pillars of epitaxial silicon 410 in the square holes in the silicon dioxide grid 1020 to extend the pillars of epitaxial silicon 410 into respective extended pillars. The epitaxial silicon 1110 is single-crystal silicon having the same crystal size and orientation as the silicon of the pillars of epitaxial silicon 410. The epitaxial silicon 1110 and the pillars of epitaxial silicon 410 become one material. The epitaxial silicon 1110 may be deposited according to various embodiments of the invention. The silicon dioxide grid 1020 is removed to expose the liner 1010 over the silicon dioxide 960. Pillars of the epitaxial silicon 1110 remain once the silicon dioxide grid 1020 is removed. The epitaxial silicon 1110 can be undoped. The epitaxial silicon 1110 can also be doped through in situ doping during its growth. The epitaxial silicon 1110 can be, for example, N-type silicon or P-type silicon according to various embodiments of the invention.

Figure 12A:
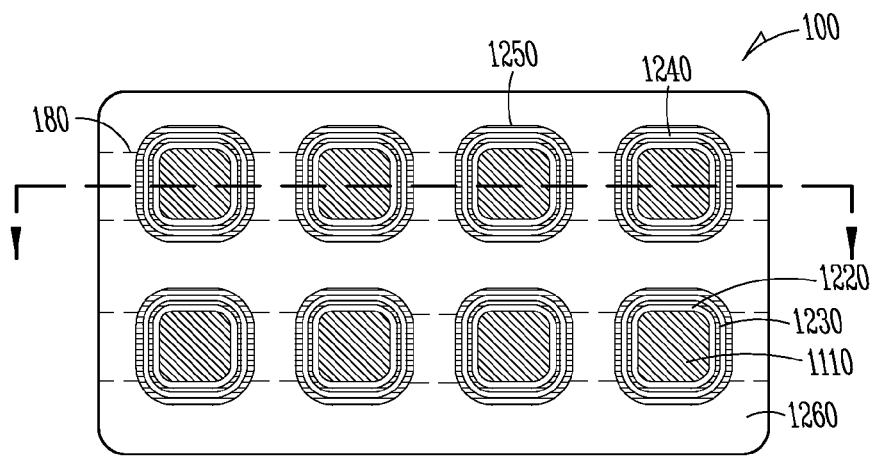
FIGS. 12A and 12B are a top view and a cross-sectional side view, respectively, of a semiconductor construction according to various embodiments of the invention.
Figure 12B:
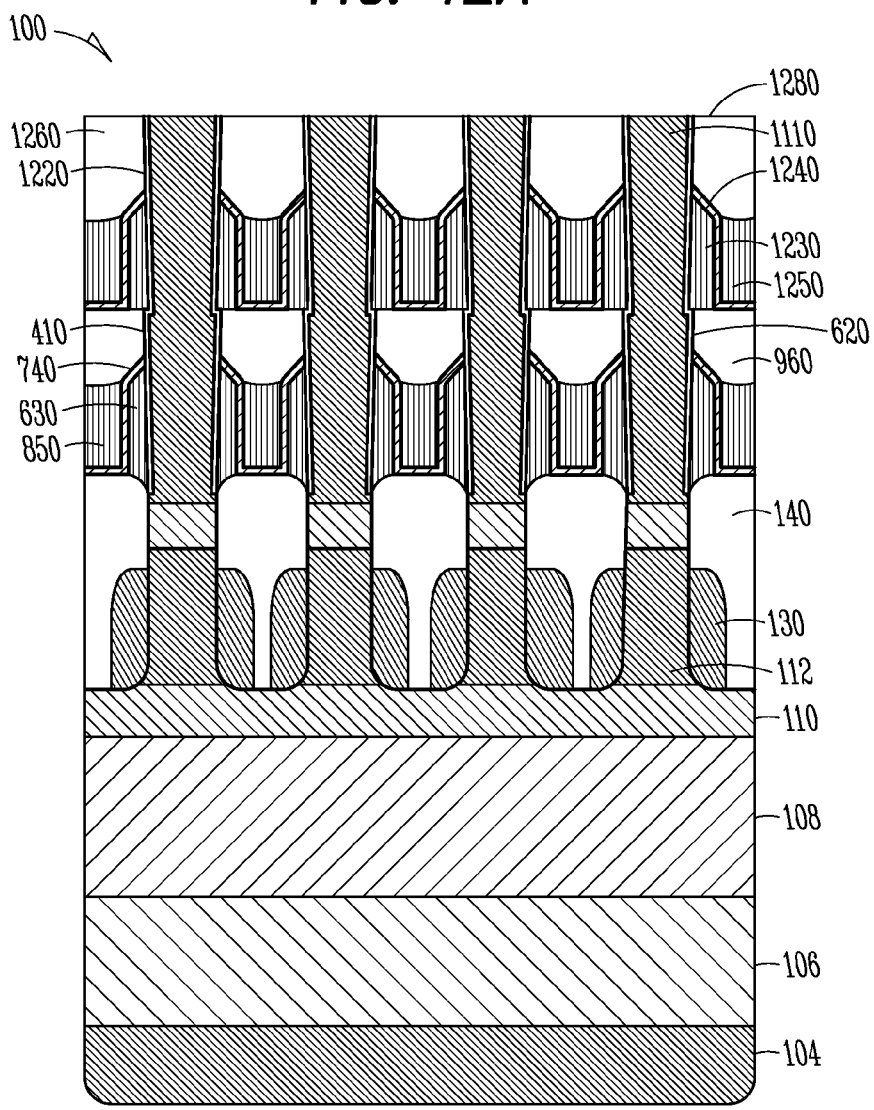

FIGS. 12A and 12B are a top view and a cross-sectional side view, respectively, of the semiconductor construction 100 according to various embodiments of the invention. The activities of fabricating the first level of complete charge storage transistors around the pillars of epitaxial silicon 410 shown in FIGS. 9A and 9B are substantially repeated following the growth of the pillars of epitaxial silicon 1110. A second level of complete charge storage transistors includes the pillars of epitaxial silicon 1110, a tunnel oxide 1220, floating gates 1230, an inter-poly dielectric layer 1240, control gates 1250 and silicon dioxide 1260. Portions of the silicon dioxide 1260, the tunnel oxide 1220 and the inter-poly dielectric layer 1240 are then removed to form a suitable top surface 1280. For example, the silicon dioxide 1260, the tunnel oxide 1220, the inter-poly dielectric layer 1240 and the pillars of epitaxial silicon 1110 are subjected to planarization such as CMP that leaves the top surface 1280 planar. The top surface 1280 may then be polished flat. Polishing the top surface 1280 exposes the pillars of epitaxial silicon 1110. The extended epitaxial silicon pillar 410 and 1110 provides channel regions for multiple charge storage transistors with floating gates 630 and 1230 and control gates 850 and 1250 around the pillar 410 and 1110 at multiple levels.

The semiconductor construction 100 shown in FIGS. 12A and 12B is an array of vertical NAND strings of memory cells, each vertical NAND string being formed in a single pillar of epitaxial silicon on a layer of silicon and multiple gates of transistors arranged around the channel.

Figure 13A:
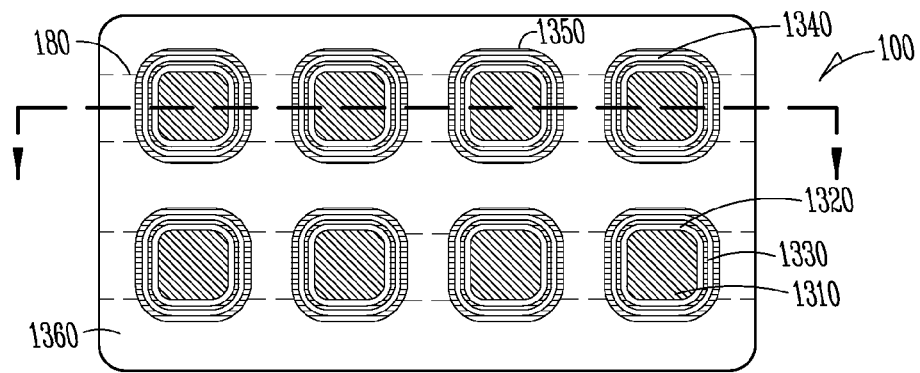
FIGS. 13A and 13B are a top view and a cross-sectional side view, respectively, of a semiconductor construction according to various embodiments of the invention.
Figure 13B:
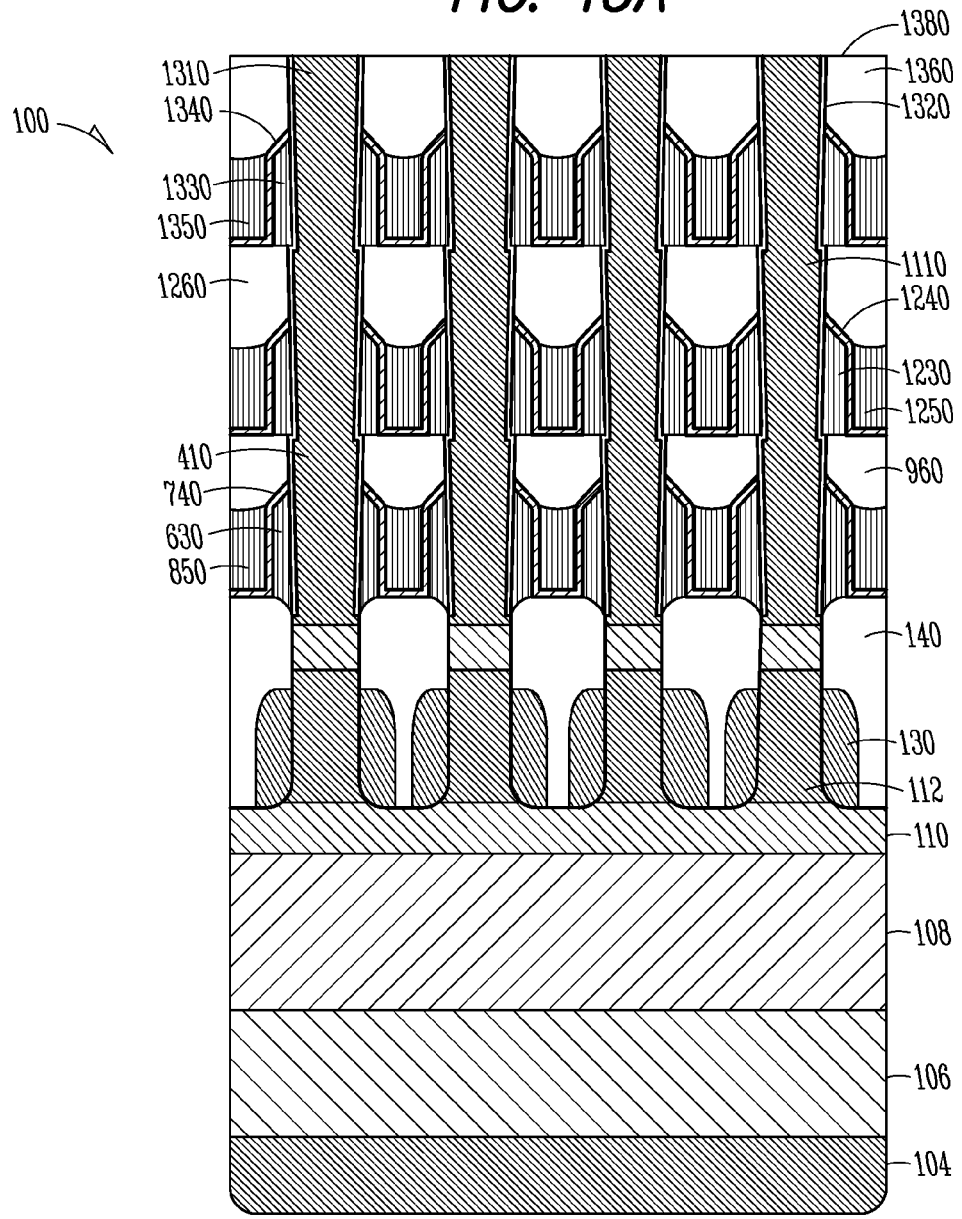

FIGS. 13A and 13B are a top view and a cross-sectional side view, respectively, of the semiconductor construction 100 according to various embodiments of the invention. The activities of fabricating the first level of complete charge storage transistors shown in FIGS. 9A and 9B and the second level of complete charge storage transistors shown in FIGS. 12A and 12B are substantially repeated to fabricate a third level of complete charge storage transistors shown in FIGS. 13A and 13B. The third level includes pillars of epitaxial silicon 1310, a tunnel oxide 1320, floating gates 1330, an inter-poly dielectric layer 1340, control gates 1350 and silicon dioxide 1360. Portions of the silicon dioxide 1360, the tunnel oxide 1320 and the inter-poly dielectric layer 1340 are then removed to form a suitable top surface 1380. For example, the silicon dioxide 1360, the tunnel oxide 1320, the inter-poly dielectric layer 1340 and the pillars of epitaxial silicon 1310 are subjected to planarization such as CMP that leaves the top surface 1380 planar. The top surface 1380 may then be polished flat. The pillars of epitaxial silicon 1310 can be undoped. The pillars of epitaxial silicon 1310 can also be doped through in situ doping during their growth. The pillars of epitaxial silicon 1310 can be, for example, N-type silicon or P-type silicon according to various embodiments of the invention.

The channels for multiple charge storage transistors are formed in the extended epitaxial silicon pillar 410, 1110 and 1310 with floating gates 630, 1230 and 1330 and control gates 850, 1250 and 1350 around the pillar 410, 1110 and 1310 at multiple levels. More than three levels of complete charge storage transistors may be fabricated according to various embodiments of the invention.

The semiconductor construction 100 shown in FIGS. 13A and 13B is an array of vertical NAND strings of memory cells, each vertical NAND string being formed in a single pillar of epitaxial silicon on a layer of silicon and multiple gates of transistors arranged around the channel. The array of vertical NAND strings is a basis of a three-dimensional NAND flash integrated circuit chip according to various embodiments of the invention.

The single-crystal silicon of the epitaxial silicon pillars shown and described herein can be of high quality when compared with polysilicon. The tunnel oxide grown on the epitaxial silicon pillars can be of high quality when compared with a deposited tunnel oxide. Every portion of the epitaxial silicon pillar can have a crystal pattern that follows the silicon that it was formed on. Each level of complete charge storage transistors of the semiconductor construction 100 requires only one mask which lowers the cost of fabrication. The charge storage transistors of the semiconductor construction 100 can be scaled further than planar transistors due to coupling between the epitaxial silicon pillar and the control gate.

Figure 14A:
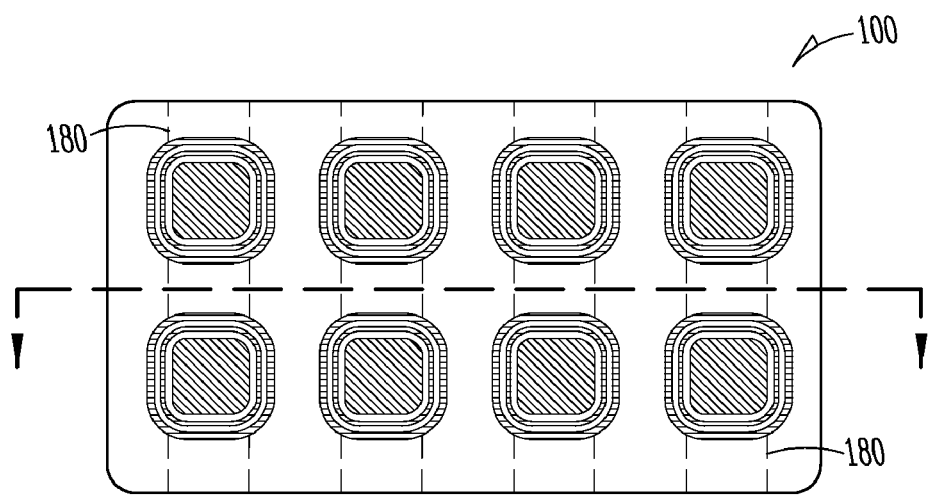
FIGS. 14A and 14B are a top view and a cross-sectional side view, respectively, of a semiconductor construction according to various embodiments of the invention.
Figure 14B:
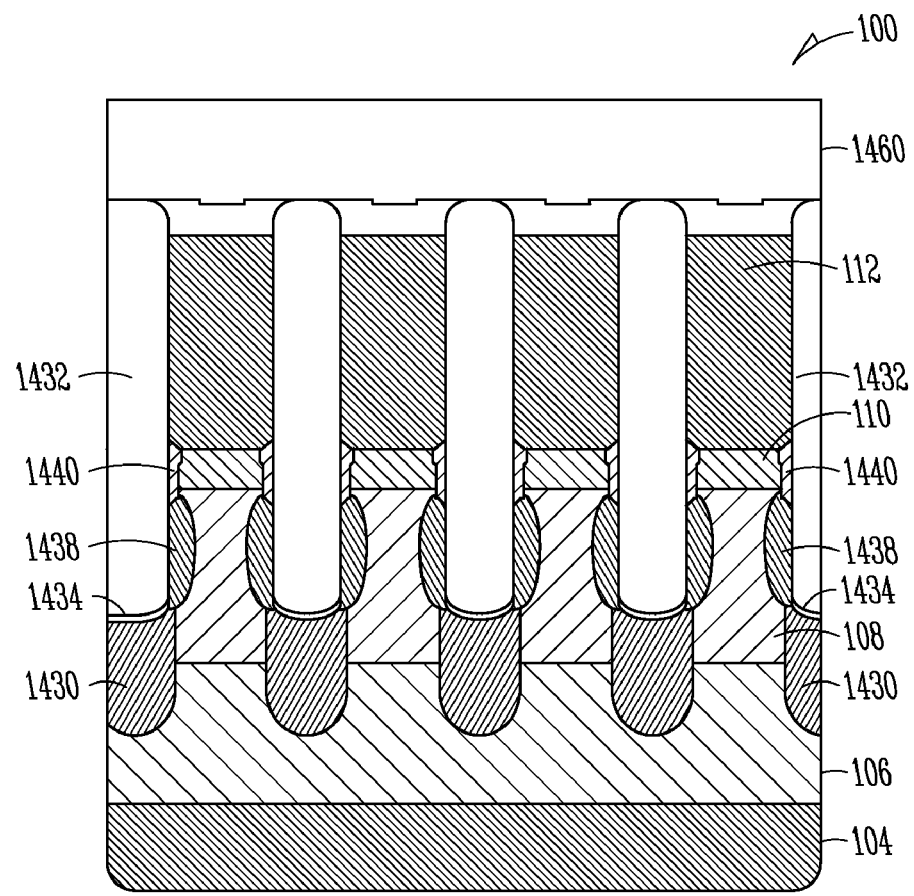

FIGS. 14A and 14B are a top view and a cross-sectional side view, respectively, of the semiconductor construction 100 according to various embodiments of the invention. The views in FIGS. 14A and 14B are orthogonal to the views in FIGS. 13A and 13B and the cross-sectional side view of the levels of charge storage transistors is not visible. FIG. 14B is a cross-sectional side view showing vertical structures that are located in the layers 106, 108, 110 and the silicon walls 112 between the charge storage transistors. Each vertical structure includes a silicon dioxide foundation 1430 formed in the layers 106 and 108. A silicon dioxide wall 1432 is formed above each foundation 1430, and the silicon dioxide wall 1432 is separated from the foundation 1430 by a liner 1434 of silicon nitride. The silicon dioxide wall 1432 extends from inside the layer 108 through the layer 110 and the silicon walls 112. A data line 1438, for example a bitline, of silicide is in contact with each silicon dioxide wall 1432 in the layer 108. A liner 1440 of silicon nitride is between each silicon dioxide wall 1432 and the layer 110. The silicide is a conductive compound of silicon with an electropositive element. Three levels 1460 of complete charge storage transistors similar to the levels shown in FIG. 13B are located over the silicon dioxide walls 1432. The silicon dioxide walls 1432 are between the vertical transistors in the semiconductor construction 100 shown in FIG. 1B to separate the vertical transistors.

Figure 15:
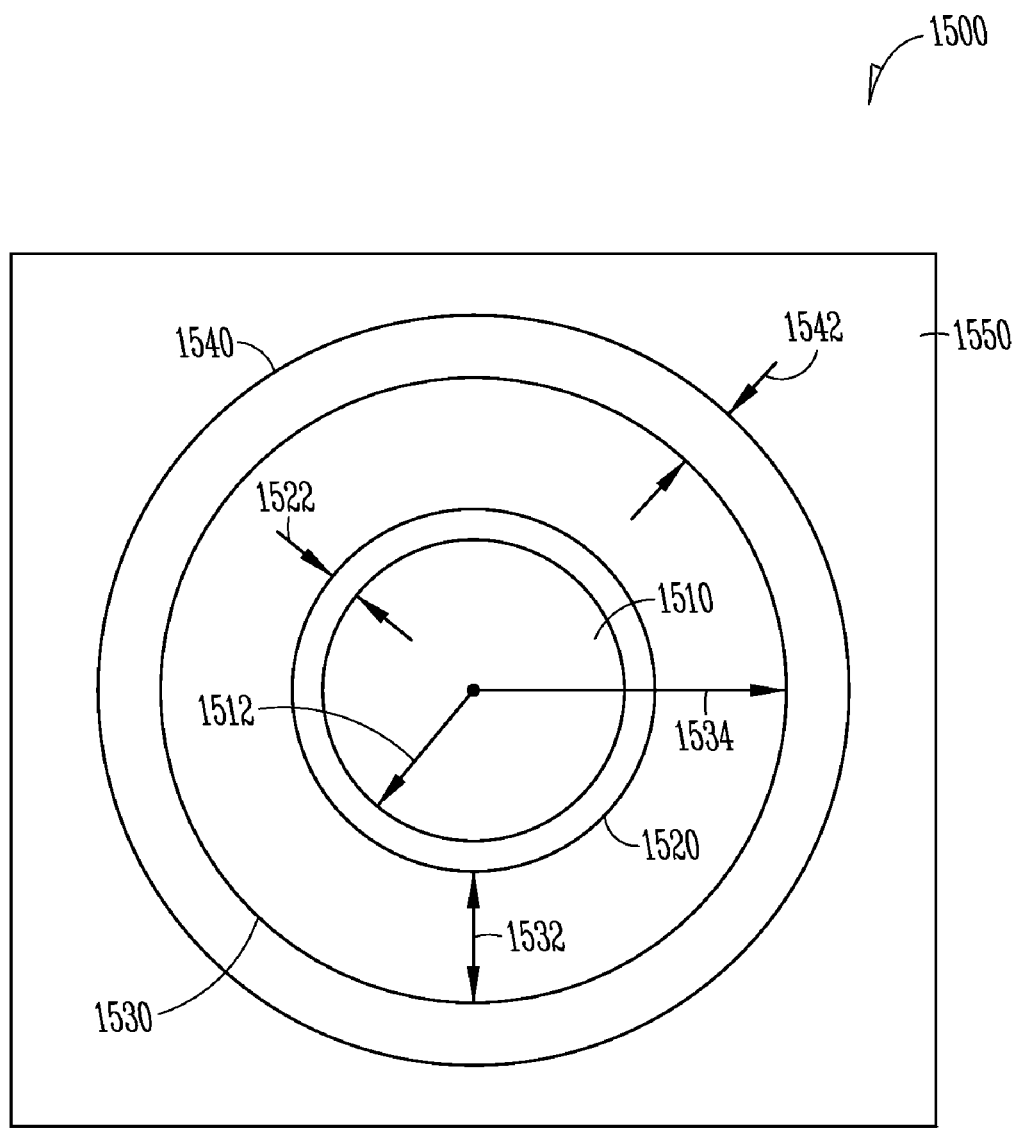
FIG. 15 is a cross-sectional view of a transistor in a semiconductor construction according to various embodiments of the invention.

FIG. 15 is a cross-sectional view of a transistor 1500 in the semiconductor construction 100 according to various embodiments of the invention. The transistor 1500 is one of the transistors in the semiconductor construction 100 shown in FIGS. 13A and 13B. At the center of the transistor 1500 is a pillar 1510 of SEG epitaxial silicon. The pillar 1510 has a radius 1512 of approximately 20 nanometers (nm) and provides for the channels of the transistors for the NAND string. The radius 1512 of the pillar 1510 can be increased or decreased to adjust a Gate Coupling Ratio (GCR) according to various embodiments of the invention. Surrounding the pillar 1510 is a tunnel oxide 1520 having a thickness 1522 of approximately 7 nm. The tunnel oxide 1520 is $SiO_2$. The tunnel oxide 1520 was grown from the pillar 1510 of epitaxial silicon. Surrounding the tunnel oxide 1520 is a floating gate 1530 of polysilicon having a thickness 1532 of approximately 20 nm. The floating gate 1530 has an outer radius 1534.

Surrounding the floating gate 1530 is an inter-poly dielectric layer 1540 of ONO having a thickness 1542 of approximately 11-14 nm. Surrounding the inter-poly dielectric layer 1540 is a control gate 1550 of titanium nitride. The control gate 1550 may also be, for example, silicon, another conductive metal nitride or a metal according to various embodiments of the invention. The control gate 1550 may also be, for example, NiSi, Ru, TaN, Ti, TiSi, WN, or $WSi_x$ according to various embodiments of the invention. The control gate 1550 is shown with a rectangular shape but is not limited to a rectangular shape and may be ovular or circular or irregular, for example. The dimensions of the transistor 1500 are approximate and may vary (e.g., by 20 percent).

Figure 16:
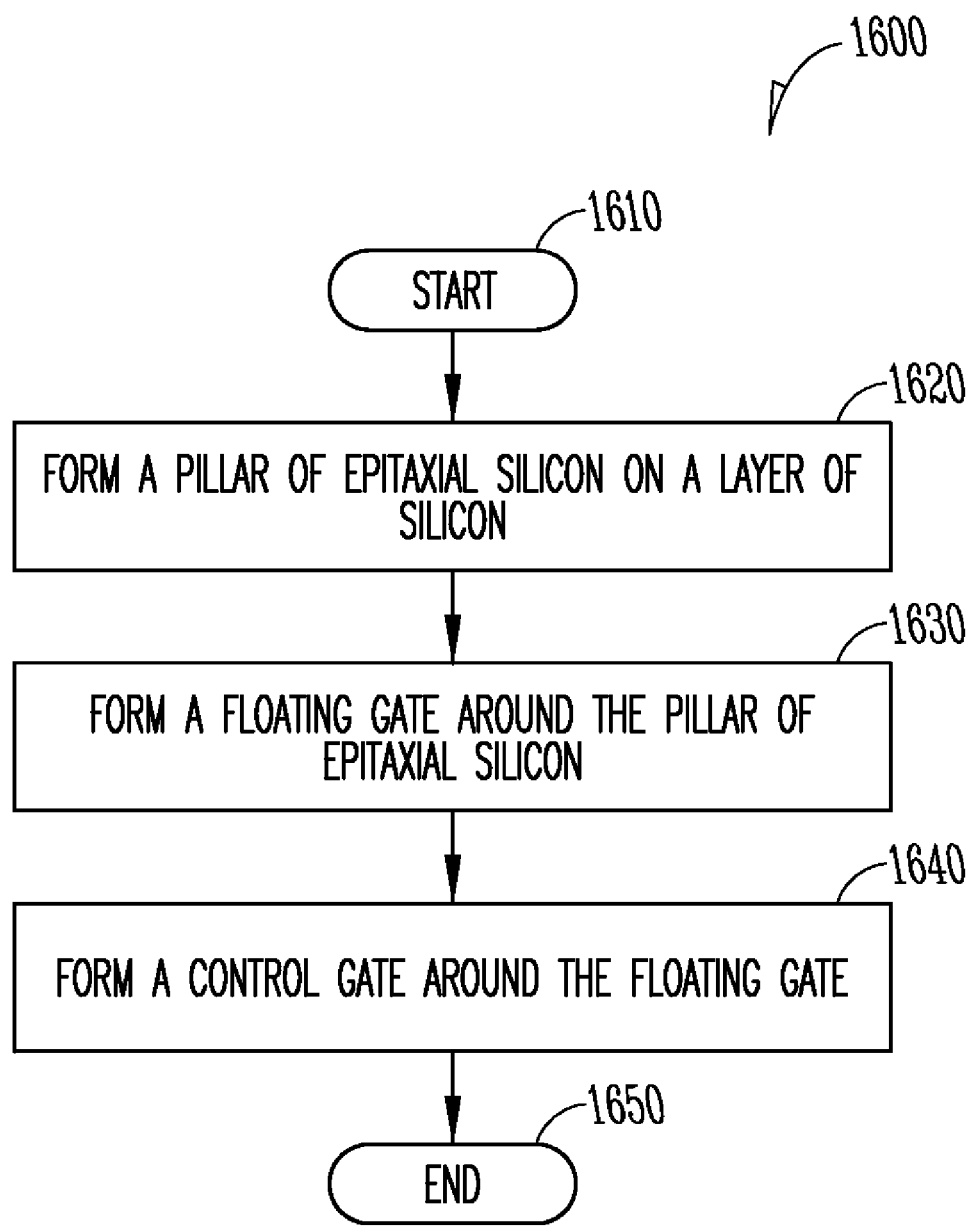
FIG. 16 is a flow diagram of methods according to various embodiments of the invention.

FIG. 16 is a flow diagram of methods 1600 according to various embodiments of the invention. In block 1610, the methods 1600 start. In block 1620, a pillar of epitaxial silicon is formed on a layer of silicon. In block 1630, a charge storage node, such as a floating gate, is formed around the pillar of epitaxial silicon. In block 1640, a control gate is formed around the floating gate. In block 1650, the methods 1600 end. Various embodiments may have more or fewer activities than those shown in FIG. 16.

Figure 17:
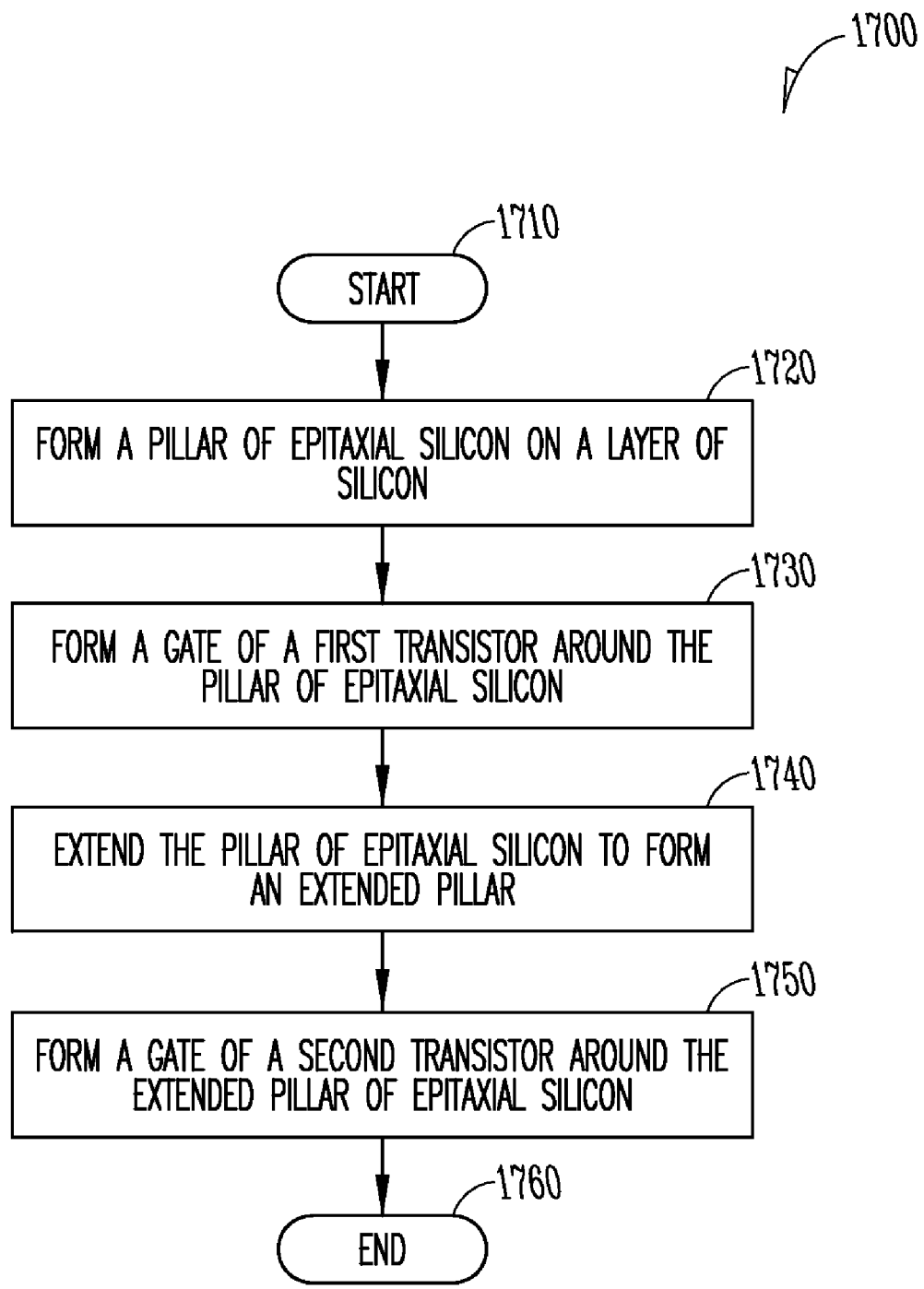
FIG. 17 is a flow diagram of methods according to various embodiments of the invention.

FIG. 17 is a flow diagram of methods 1700 according to various embodiments of the invention. In block 1710, the methods 1700 start. In block 1720, a pillar of epitaxial silicon is formed on a layer of silicon. In block 1730, a gate of a first transistor is formed around the pillar of epitaxial silicon. In block 1740, the pillar of epitaxial silicon is extended to form an extended pillar. In block 1750, a gate of a second transistor is formed around the extended pillar of epitaxial silicon. In block 1760, the methods 1700 end. Various embodiments may have more or fewer activities than those shown in FIG. 17.

Existing memory devices are expensive to fabricate and may not be scalable. The inventors have discovered that the challenges noted above, as well as others, can be addressed by forming a pillar of epitaxial silicon on a layer of silicon and forming one or more gates around the pillar of epitaxial silicon to form one or more charge storage transistors.

Figure 18:
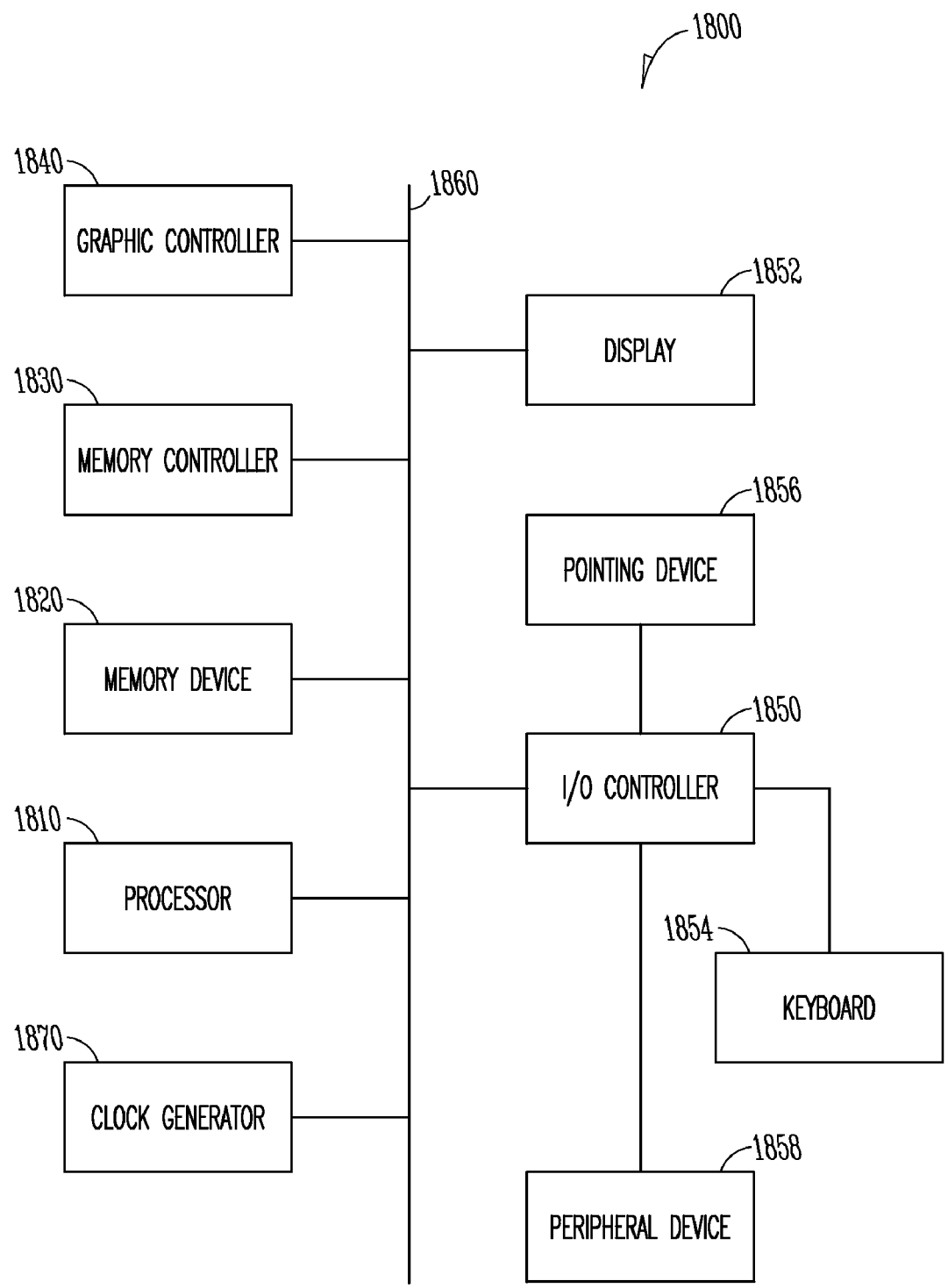
FIG. 18 is a diagram illustrating a system according to various embodiments of the invention.

FIG. 18 is a diagram illustrating a system 1800 according to various embodiments of the invention. The system 1800 may include a processor 1810, a memory device 1820, a memory controller 1830, a graphic controller 1840, an input and output (I/O) controller 1850, a display 1852, a keyboard 1854, a pointing device 1856, and a peripheral device 1858. A bus 1860 couples all of these devices together. A clock generator 1870 is coupled to the bus 1860 to provide a clock signal to at least one of the devices of the system 1800 through the bus 1860. The clock generator 1870 may include an oscillator in a circuit board such as a motherboard. Two or more devices shown in system 1800 may be formed in a single integrated circuit chip.

The memory device 1820 may comprise a non-volatile memory including charge storage transistors described herein and shown in the figures according to various embodiments of the invention. The bus 1860 may be interconnect traces on a circuit board or may be one or more cables. The bus 1860 may couple the devices of the system 1800 by wireless means such as by electromagnetic radiations, for example, radio waves. The peripheral device 1858 coupled to the I/O controller 1850 may be a printer, an optical device such as a CD-ROM and a DVD reader and writer, a magnetic device reader and writer such as a floppy disk driver, or an audio device such as a microphone.

The system 1800 represented by FIG. 18 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any of the circuits or systems described herein may be referred to as a module. A module may comprise a circuit and/or firmware according to various embodiments.

Example structures and methods of fabricating charge storage transistors have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
a pillar, every portion of the pillar comprising epitaxially grown semiconductor material;
a first charge storage node around the pillar at a first level;
a first control gate around the first charge storage node at the first level;
a second charge storage node around the pillar at a second level; and
a second control gate around the second charge storage node at the second level.

2. The apparatus of claim 1, wherein the pillar is configured to provide channels to a plurality of charge storage transistors in a NAND string, wherein a first one of the charge storage transistors comprises the first charge storage node and the first control gate and wherein a second one of the charge storage transistors comprises the second charge storage node and the second control gate.

3. The apparatus of claim 1, further comprising:
tunnel oxide between each of the charge storage nodes and the pillar; and
a dielectric between each of the control gates and a respective one of the charge storage nodes.

4. The apparatus of claim 1, wherein the pillar comprises selective epitaxial grown silicon.

5. The apparatus of claim 1, wherein:
each of the charge storage nodes partially surrounds the pillar; and
each of the control gates partially surrounds the pillar.

6. The apparatus of claim 1, wherein:
each of the charge storage nodes comprises polysilicon and surrounds the pillar;
each of the control gates comprises titanium nitride surrounds the pillar and surrounds a respective one of the charge storage nodes;
a tunnel oxide comprising silicon dioxide is between each of the charge storage nodes and the pillar; and a dielectric comprising oxide-nitride-oxide is between each of the control gates and a respective one of the charge storage nodes.

7. The apparatus comprising:
a pillar of epitaxially grown semiconductor material;
a first charge storage node around the pillar at a first level;
a first control gate around the first charge storage node at the first level;
a second charge storage node around the pillar at a second level; and
a second control gate around the second charge storage node at the second level, wherein
each of the charge storage nodes comprises polysilicon and surrounds the pillar, and each of the control gates surrounds the pillar.

8. The apparatus of claim 7, wherein the pillar is configured to provide channels to a plurality of charge storage transistors in a NAND string, wherein a first one of the charge storage transistors comprises the first charge storage node and the first control gate and wherein a second one of the charge storage transistors comprises the second charge storage node and the second control gate.

9. The apparatus of claim 7, further comprising:
tunnel oxide between each of the charge storage nodes and the pillar; and
a dielectric between each of the control gates and a respective one of the charge storage nodes, wherein the pillar comprises selective epitaxial grown silicon.

10. The apparatus of claim 7, wherein:
each of the charge storage nodes partially surrounds the pillar; and
each of the control gates partially surrounds the pillar.

11. The apparatus of claim 7, wherein:
each of the control gates comprises titanium nitride and surrounds a respective one of the charge storage nodes;
a tunnel oxide comprising silicon dioxide is between each of the charge storage nodes and the pillar; and
a dielectric comprising oxide-nitride-oxide is between each of the control gates and a respective one of the charge storage nodes.

12. A memory device comprising:
an array of pillars, every portion of each of the pillars comprising epitaxially grown semiconductor material;
a plurality of first and second charge storage nodes, each first charge storage node and each second charge storage node being around a respective one of the pillars, wherein the first charge storage nodes are around the pillars at a different vertical level than the second charge storage nodes; and
a plurality of control gates, each control gate being around a respective one of the charge storage nodes.

13. The memory device of claim 12, wherein each pillar comprises selective epitaxial grown silicon.

14. The memory device of claim 12, wherein the first and second charge storage nodes around each respective pillar and the control gates around each respective pillar comprise a NAND string of transistors formed in the respective pillar.

15. The memory device of claim 14, further comprising a plurality of vertical transistors, each vertical transistor being below a respective one of the pillars to select a respective one of the NAND strings.

16. The memory device of claim 12, wherein:
each of the charge storage nodes comprises polysilicon and surrounds the pillar;
each of the control gates comprises titanium nitride and surrounds a respective one of the pillars and surrounds a respective one of the charge storage nodes;
a tunnel oxide comprising silicon dioxide is between each of the charge storage nodes and the pillar; and
a dielectric comprising oxide-nitride-oxide is between each of the control gates and a respective one of the charge storage nodes.

17. A memory device comprising:
an array of epitaxially grown pillars of semiconductor material;
a plurality of first and second charge storage nodes, each first charge storage node and each second charge storage node being around a respective one of the pillars, wherein the first charge storage nodes are around the pillars at a different vertical level than the second charge storage nodes;
a plurality of control gates, each control gate being around a respective one of the charge storage nodes wherein the first and second charge storage nodes around each respective pillar and the control gates around each respective pillar comprise a NAND string of transistors formed in the respective pillar; and
a plurality of vertical transistors, each vertical transistor being below a respective one of the pillars to select a respective one of the NAND strings wherein each vertical transistor includes:
a double-sided select gate;
a source;
a channel above the source and between the double-sided select gate; and
a drain above the channel and below a respective one of the pillars.

18. The memory device of claim 17, wherein each pillar comprises selective epitaxial grown silicon.

19. The memory device of claim 17, wherein:
each of the charge storage nodes comprises polysilicon and surrounds a respective one of the pillars;
each of the control gates comprises titanium nitride and surrounds a respective one of the pillars and surrounds a respective one of the charge storage nodes;
a tunnel oxide comprising silicon dioxide is between each of the charge storage nodes and the respective pillar; and
a dielectric comprising oxide-nitride-oxide is between each of the control gates and a respective one of the charge storage nodes.

20. A memory device comprising:
an array of epitaxially grown pillars of semiconductor material;
a plurality of first and second charge storage nodes, each first charge storage node and each second charge storage node being around a respective one of the pillars, wherein the first charge storage nodes are around the pillars at a different vertical level than the second charge storage nodes;
a plurality of control gates, each control gate being around a respective one of the charge storage nodes wherein the first and second charge storage nodes around each respective pillar and the control gates around each respective pillar comprise a NAND string of transistors formed in the respective pillar;
a plurality of vertical transistors, each vertical transistor being below a respective one of the pillars to select a respective on of the NAND strings:
a plurality of vertical silicon dioxide walls below the pillars, each silicon dioxide wall being between selected ones of the vertical transistors to separate the vertical transistors; and
a data line in contact with each wall, each data line comprising silicide, wherein each control gate is recessed at or below a respective one of the charge storage nodes, and each pillar comprises doped semiconductor material.

21. The memory device of claim 20, wherein each pillar comprises selective epitaxial grown silicon.

22. The memory device of claim 20, wherein:
each of the charge storage nodes comprises polysilicon and surrounds a respective one of the pillars;
each of the control gates comprises titanium nitride and surrounds a respective one of the pillars and surrounds a respective one of the charge storage nodes;
a tunnel oxide comprising silicon dioxide is between each of the charge storage nodes and the respective pillar; and
a dielectric comprising oxide-nitride-oxide is between each of the control gates and a respective one of the charge storage nodes.

23. The memory device of comprising:
an array of epitaxially grown pillars of semiconductor material;
a plurality of first and second charge storage nodes, each first charge storage node and each second charge storage node being around a respective one of the pillars, wherein the first charge storage nodes are around the pillars at a different vertical level than the second charge storage nodes; and
a plurality of control gates, each control gates being around a respective one of the charge storage nodes wherein the array of pillars are formed on a plurality of walls of lightly P doped silicon over a layer of lightly N doped silicon over a layer of heavily N doped silicon over a layer of P doped silicon over a layer of lightly P doped silicon.

24. The memory device of claim 23, wherein each pillar comprises selective epitaxial grown silicon.

25. The memory device of claim 23, wherein the first and second charge storage nodes around each respective pillar and the control gates around each respective pillar comprise a NAND string of transistors formed in the respective pillar.

26. The memory device of claim 23, wherein:
each of the charge storage nodes comprises polysilicon and surrounds a respective one of the pillars;
each of the control gates comprises titanium nitride and surrounds a respective one of the pillars and surrounds a respective one of the charge storage nodes;
a tunnel oxide comprising silicon dioxide is between each of the charge storage nodes and the respective pillar; and
a dielectric comprising oxide-nitride-oxide is between each of the control gates and a respective one of the charge storage nodes.

\* \* \* \* \*

UNITED STATES PATENT AND TRADEMARK OFFICE
CERTIFICATE OF CORRECTION

PATENT NO. : 8,357,970 B2
APPLICATION NO. : 12/757727
DATED : January 22, 2013
INVENTOR(S) : Gurtej S. Sandhu et al.

It is certified that error appears in the above-identified patent and that said Letters Patent is hereby corrected as shown below:

In column 9, line 4, in Claim 7, delete "The" and insert -- An --, therefor.

In column 10, line 61, in Claim 20, delete "strings:" and insert -- strings; --, therefor.

In column 11, line 18, in Claim 23, delete "The" and insert -- A --, therefor.

In column 11, line 18, in Claim 23, after "device" delete "of".

In column 12, line 1, in Claim 23, after "each control" delete "gates" and insert -- gate --, therefor.

Signed and Sealed this
Ninth Day of April, 2013

Teresa Stanek Rea
*Acting Director of the United States Patent and Trademark Office*